United States Patent

[11] 3,602,634

[72] Inventor William P. Meuli
Sunnyvale, Calif.
[21] Appl. No. 21,632
[22] Filed Mar. 23, 1970
[45] Patented Aug. 31, 1971
[73] Assignee Fairchild Camera and Instrument Corporation
Mountain View, Calif.

[54] HERMETIC SEAL

9 Claims, 4 Drawing Figs.

[52] U.S. Cl. .......... 174/52 S, 29/588, 174/DIG. 3, 174/50.61, 317/234 G
[51] Int. Cl. .......... H01l 1/02
[50] Field of Search .......... 174/50.5, 50.61, 50.63, 52 S, 52 PE, 52 FP, 50.56; 317/101 A, 101 CP, 234

[56] References Cited

UNITED STATES PATENTS

| | | | |
|---|---|---|---|
| 2,826,630 | 3/1958 | Klebanoff et al. .......... | 174/50.63 X |
| 3,404,215 | 10/1968 | Burks et al. .......... | 174/52 S |

FOREIGN PATENTS

| | | | |
|---|---|---|---|
| 45,437 | 1/1966 | Germany .......... | 174/50.5 |

*Primary Examiner*—Darrell L. Clay
*Attorneys*—Roger S. Borovoy, Alan MacPherson and Charles L. Botsford

ABSTRACT: A semiconductor package contains a cover with a flange around that portion of the edge in contact with the bottom of the package. The flange makes an acute angle with the package bottom. Bonding material placed between the flange and the package bottom, when melted, is drawn by capillary action along facing surfaces of the flange and package bottom thereby to form a solid bond between the cover and the bottom.

INVENTOR.
WILLIAM P. MEULI
BY Alan H. MacPherson
ATTORNEY

HERMETIC SEAL

BACKGROUND OF THE INVENTION

1. Field of the Invention

This invention relates to semiconductor packages and in particular to a semiconductor package where the package cover contains a flange which makes an acute angle with the underlying substrate containing the semiconductor devices. As a result, the package cover can be attached to the substrate by a layer of bonding material of substantially uniform thickness.

2. Description of the Prior Art

Semiconductor devices are often quite sensitive to environmental conditions. Changes in humidity in particular often adversely affect device characteristics. Thus it is standard practice to protect semiconductor devices from the environment by hermetically sealing these devices in packages. A large variety of packages have been produced to do this. One of the most widely used packages is the so-called "dual in-line" or "-dip" package widely used in the semiconductor industry. This package consists basically of two ceramic parts, one of which contains a cavity for receiving the semiconductor device. These ceramic parts are joined by a sealing glass and leads from the encapsulated semiconductor device extend through the sealing glass in the plane of the sealant and then bend 90° from the plane of the sealant for insertion purposes. The dual in-line package has proven to be adequate for sealing small integrated circuits and hybrid circuits. However the size of the package, about three-fourths by one-fourth by one-eighth inches, limits the number or size of components which can be sealed in the package. As more and more functions are being placed on a single wafer and as the wafer itself becomes larger, packages suitable for sealing large semiconductor devices become necessary.

One of the problems with large semiconductor packages is that slight unevennesses in the surface of the substrate on which the semiconductor device is mounted result in uneven distribution of the bonding material between the substrate and the lid. As the lid is bonded, pressure is placed on the lid. When the sealing material is heated, it softens and the uneven surfaces tend to squeeze together forcing out the soft sealing material. Consequently, the bond is of nonuniform thickness and thus nonuniform strength, and in fact, in some areas may be altogether lacking. If the sealing material consists of layers of different materials, the bond may even be of nonuniform composition. Consequently, the package is more likely to fail.

One attempt to overcome this problem is disclosed by Teruyoshi Asai, in U.S. patent application Ser. No. 770,215, filed Oct. 24, 1968, and assigned to Fairchild Camera and Instrument Corporation, the assignee of this application. Asai spaces the cover from the underlying substrate by small spacers stamped from the cover. This ensures that the cover stays a substantially uniform distance from the underlying substrate regardless of gross unevennesses in the surface. Asai's cover, however, still can have nonuniform thickness of bonding material between it and the substrate due to very rapid fluctuations in the two surfaces.

SUMMARY OF THE INVENTION

This invention, on the other hand, overcomes the above problem. Using the structure of this invention, the bonding layer between the package cover and the underlying substrate is substantially uniform in thickness regardless of the pressure placed upon the cover to force the cover against the underlying substrate. Thus, pressures greater than those used in the prior art to force covers against substrates can be applied to the structure of this invention without detrimentally affecting the resulting bond. This greatly enhances reliability of the resulting package.

In one embodiment, the bond between the package cover and substrate is formed in such a manner that its continuity and thickness can be visually checked.

According to this invention, a cover for use in sealing a semiconductor device on a substrate has a flange formed around the edge to be placed in contact with the substrate. This flange makes an acute angle with the substrate surface such that only the intersection of the flange with the sides of the cover contacts the underlying substrate. The rest of the flange then rises up from the substrate at an angle. Beneath the outer edge of the flange is placed a continuous strip, wire, or other shape of bonding material.

To form the bond between the cover and the substrate, pressure is applied to the cover, forcing the cover against the substrate. The package assembly is then heated, melting the bonding material beneath the outer edges of the flange. As the bonding material melts, capillary forces draw the bonding material along the surfaces of both the flange and the substrate into contact with all portions of the bottom side of the flange and the underlying portions of the substrate. Heat is applied for a sufficient time to ensure wetting of all the adjacent surfaces of the flange and the substrate. Then the assembly is removed from the furnace and allowed to cool. The result is a semiconductor package in which the cover makes firm intimate contact with the underlying substrate at all points, regardless of the unevenness of the underlying substrate or the cover itself, and which possesses a substantially uniform bond between the cover and the underlying substrate. Description of the Figures:

Detailed Description

Figure 1:
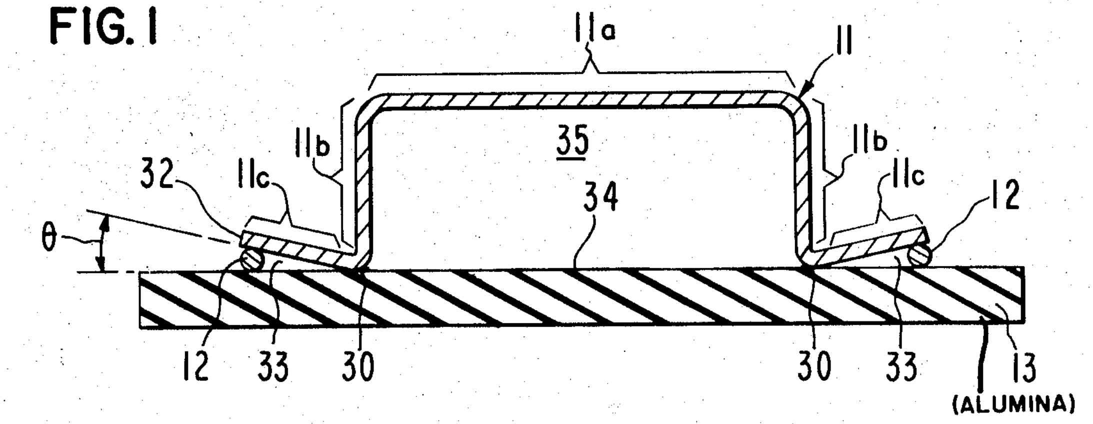
FIG. 1 shows a cross section of the cover of this invention, placed on an underlying substrate with the bonding material before heating.

Cover 11, shown schematically in FIG. 1, illustrates the package cover of this invention. As shown in FIG. 1, edge 30 of cover 11 is pressed into intimate contact with the top surface 34 of substrate 13. Cover 11 contains a top portion 11*a*, sides 11*b* substantially perpendicular to the top portion thereof, and flange portion 11*c*, hereafter referred to as "-flange 11*c*," which makes an acute angle, as shown, with top surface 34 of substrate 13. Cover 11 makes intimate contact with top surface 34 at the intersection 30 of sides 11*b* and flange 11*c*. Placed between the outer portion 32 of flange 11*c* and the directly underlying portion of surface 34 of substrate 13 is bonding material 12. Conveniently shown as a wire because in this shape the bonding material 12 is easy to handle, this bonding material can also be a layer of bonding material formed on underlying substrate 13 in a suitable pattern to match the outer shape of flange 11*c*. It should be noted that while cover 11 as shown has approximately a rectangular cross section, cover 11 could of course, have a wide variety of cross sections. Furthermore, while not shown in the drawing it should be understood that placed within cavity 35, between cover 11 and underlying substrate 13, can be a plurality of semiconductor devices selectively interconnected by lead patterns formed on the top surface of substrate 13. For simplicity in explaining this invention, the semiconductor devices and their interconnecting lead patterns are not shown in detail.

Figure 2:
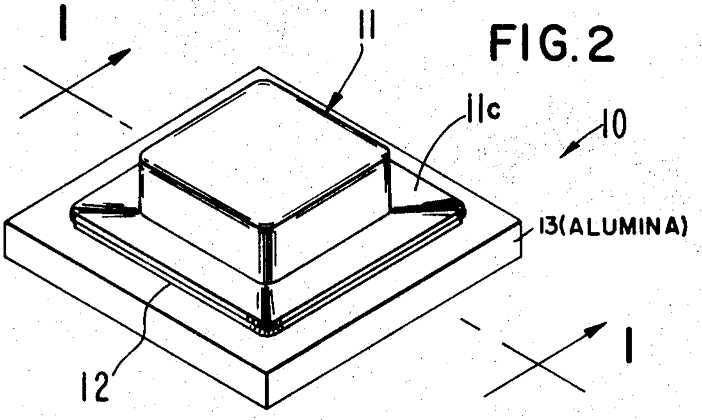
FIG. 2 shows an isometric view of one possible embodiment of the package of this invention.

FIG. 2 shows isometrically one possible package employing the principles of this invention. Cover 11 is attached to substrate 13 by bonding material 12 formed beneath flange 11*c*. FIG. 1 is, in fact, a cross-sectional view of the package shown in FIG. 2.

Figure 3:
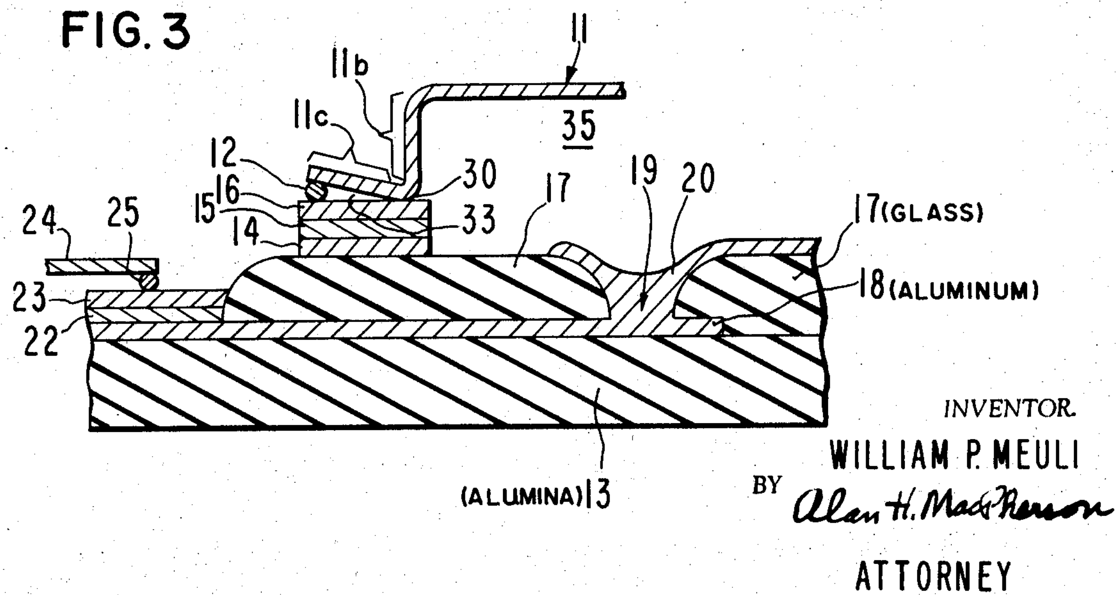
FIG. 3 shows in detail one possible structure using the principles of this invention.

FIG. 3 shows in more detail, an actual composite structure using this invention. While FIG. 3 will be described in terms of specific materials, it should be understood of course, that the structure of this invention can be used with a wide variety of materials and that the description which follows represents only one possible embodiment of this invention. As shown in FIG. 3, substrate 13 has formed upon it a conductive metal pattern 18. This pattern is used to connect devices contained within cavity 35 to circuits outside the package. In one embodiment, metal leads 18 are formed of aluminum evaporated onto substrate 13. This aluminum layer is then formed into the desired interconnective pattern using photoresist techniques. Substrate 13 typically is alumina, $Al_2O_3$.

Over metal layer 18, glass 17 is next formed. Typically, glass 17 is a low temperature glass such as a mixture by weight of about 65 percent PbO plus about 10 percent $Al_2O_3$, 10 percent $SiO_2$, 3 percent $TiO_2$ and the balance boron. This glass is deposited by the well-known centrifuging technique onto metal layer 18. This glass fuses at a temperature lower than the aluminum melting point and does not react with the aluminum. Following the formation of glass layer 17, windows such as window 19, are etched through layer 17 to expose the underlying metal lead pattern 18. Additional aluminum 20 is then deposited through these windows over the top surface of glass 17 to contact the exposed portions of metal 18. This aluminum will be used to make contact with the devices sealed within cavity 35 by cover 11.

On top of glass 17 in a selected area is next formed another layer of metal 14, typically aluminum. Over aluminum 14 will be placed a barrier layer to prevent migration of certain metals contained in bonding material 12 into the underlying metal layer 14. When metal layer 14 is aluminum, barrier layer 15 is typically nickel. This nickel layer is typically electroplated to about 5 microns thickness. Next, over the barrier layer 15 is formed a contact or wetting layer 16. When barrier layer 15 is nickel, contact layer 16 is often copper. Layer 16 is typically 100 microinches and is overlaid by a surface flash of gold to the thickness of 20 microinches. This gold prevents oxidation of the underlying copper.

To place cover 11 on the device, a bonding material 12 is laid or placed around the top outer surface of layer 16. When cover 11 is Kovar, a commonly used material consisting of nickel, iron and cobalt, bonding material 12 is often a gold-tin braze in the form of a wire. Cover 11 is placed on top of layer 16 such that the intersection 30 of flange **11*c* and side 11*b* contacts the top surface of layer 16. Beneath the outer edge of flange 11*c* is bonding material 12. Pressure is then applied to cover 11 forcing edge portion 30 of cover 11 tightly against layer 16. When the entire assembly is placed in a furnace, bonding material 12 is melted, thereby traveling by capillary action into region 33 of the cavity between flange 11*c* and layer 16. Any gas trapped in cavity 33 is either forced into cavity 35 or escapes through molten bonding material 12. Upon completion of the flow of bonding material 12, the package is removed from the furnace, and allowed to cool. The resulting bond can be visually inspected to ensure that bonding material is uniformly attached to the outer portions of flange 11*c* and to the underlying metal contact layer 16. Regardless of the pressure applied to package 11**, the resulting bond is of substantially uniform thickness.

One of the major advantages of this invention is that the flow of bonding material 12 into cavity 33 due to capillary action, breaks any skin of impurities which may have formed on the outer surface of bonding material 12. Typically this skin is an oxide of the bonding material which in prior art bonds degrades the quality of the bond. In accordance with this invention, however, the flowing of the bonding material ruptures this skin and allows a bond of substantially pure bonding material to form between flange **11*c* and substrate 13**.

Figure 4:
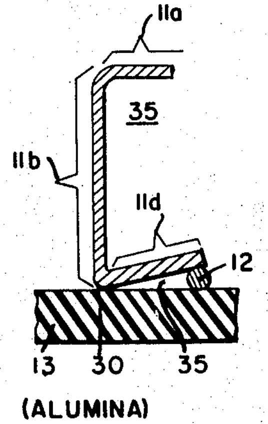
FIG. 4 shows an alternative embodiment of the package of this invention.

While flange **11*c* has been shown in FIG. 1 as pointed outward from the package, an alternative embodiment has flange 11*c* pointed into the package as shown in FIG. 4. This embodiment has the advantage that as bonding material 12 melts and is drawn by capillary action along the surfaces of flange 11*d* and substrate 13 toward edge 30 of cover 11, gases trapped in front of the bonding material are forced out beneath cover 11. Furthermore, as the assembly is heated in a furnace, gas trapped in cavity 35 expands. The increased gas pressure works with the capillary forces to force bonding material 12 into cavity 33'. Gas in cavity 33' is driven from the cavity between edge 30 and substrate surface 34**.

It should be noted that it may be possible to attach cover 11, in some instances, directly to aluminum layer 14 without intermediate metal layers 15 and 16. This leads to a particularly simple implementation of the invention because aluminum layer 14 can be formed as port of the second metallization layer on substrate 13.

What is claimed is:

1. A semiconductor package comprising a substrate containing on one surface thereof at least one semiconductor device surrounded by a rim of at least one contact metal, a cover with an edge contacting said rim, a flange being attached to said edge, said flange at least partly overlying and making an acute angle with the surface of said rim, and bonding material between said flange and the underlying rim joining said cover to said underlying substrate.

2. The package in claim 1 wherein said flange rises up and outward from the edge of said cover.

3. Structure as in claim 1 wherein said flange rises up and inward from the edge of said cover.

4. Structure as in claim 1 wherein said substrate comprises an aluminum oxide ceramic containing thereon a first layer of metallization overlaid by a glass layer on which is formed a second layer of metallization in electrical connection to said at least one semiconductor device, said second layer of metallization selectively contacting through windows in said glass layer said first layer of metallization, said first layer of metallization extending beneath said rim to thereby provide external contact to said at least one semiconductor device within said package, and said rim of at least one contact metal comprising an electrically isolated annular portion of said second layer of metallization on which are formed a plurality of layers of metal, said plurality of layers of metal including a barrier layer of metal formed directly on said rim, and a wettable layer of metal formed on said barrier layer of metal.

5. Structure as in claim 4 wherein said second layer of metallization comprises aluminum, said barrier layer of metal comprises nickel, and said wettable layer of metal comprises copper.

6. Structure as in claim 5 wherein a thin layer of gold is placed on said layer of copper.

7. Structure as in claim 6 wherein said bonding material comprises a gold-tin mixture.

8. Structure as in claim 7 wherein said cover is made of a material consisting of a combination of nickel, iron and cobalt;

9. Structure as in claim 8 wherein said glass comprises a mixture of65 percent lead oxide, about 10 percent alumina, 10 percent silicon dioxide, 3 percent titanium oxide and the remainder boron.